(12) United States Patent
Tamanuki

(10) Patent No.: US 8,432,697 B2
(45) Date of Patent: Apr. 30, 2013

(54) CIRCUIT BOARD

(75) Inventor: Takemasa Tamanuki, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 257 days.

(21) Appl. No.: 12/926,271

(22) Filed: Nov. 5, 2010

(65) Prior Publication Data

US 2012/0050991 A1    Mar. 1, 2012

(30) Foreign Application Priority Data

Aug. 26, 2010   (JP) .................................. 2010-189673

(51) Int. Cl.
*H05K 7/20*   (2006.01)

(52) U.S. Cl.
USPC ............ 361/719; 361/696; 361/697; 361/720

(58) Field of Classification Search .................. 361/695, 361/719–720
See application file for complete search history.

(56) References Cited

U.S. PATENT DOCUMENTS

| | | | |
|---|---|---|---|
| 6,094,346 A * | 7/2000 | Schweers et al. | 361/695 |
| 6,113,485 A * | 9/2000 | Marquis et al. | 454/184 |
| 6,113,488 A * | 9/2000 | Tiede | 454/276 |
| 6,377,459 B1 * | 4/2002 | Gonsalves et al. | 361/700 |
| 6,721,108 B2 * | 4/2004 | Sasaki et al. | 359/793 |
| 6,721,180 B2 * | 4/2004 | Le et al. | 361/695 |
| 6,778,390 B2 * | 8/2004 | Michael | 361/695 |
| 6,888,725 B2 * | 5/2005 | Kubo et al. | 361/719 |
| 7,606,029 B2 * | 10/2009 | Mahalingam et al. | 361/700 |
| 2002/0172008 A1 * | 11/2002 | Michael | 361/697 |
| 2007/0091566 A1 * | 4/2007 | Sun | 361/695 |
| 2008/0158820 A1 * | 7/2008 | Peng et al. | 361/703 |

FOREIGN PATENT DOCUMENTS

JP   2010-67731   3/2010

* cited by examiner

*Primary Examiner* — Gregory Thompson
(74) *Attorney, Agent, or Firm* — Nixon & Vanderhye PC

(57) ABSTRACT

A circuit board provided with a control circuit and an optical module placed at a close distance and configured to be capable of effectively cooling the control circuit and the optical module is provided. A circuit board placed inside the housing of electronic equipment and provided with an optical module and a control circuit, which are mutually connected, has: a fan-assisted heat sink mounted on the control circuit and configured to ventilate the control circuit and cool the control circuit; and a fresh air feeding duct placed on the circuit board and configured to distribute fresh air taken in from outside the housing through the intake of the fan-assisted heat sink. The optical module is placed in a predetermined position along a site in which the fresh air feeding duct is formed.

8 Claims, 7 Drawing Sheets

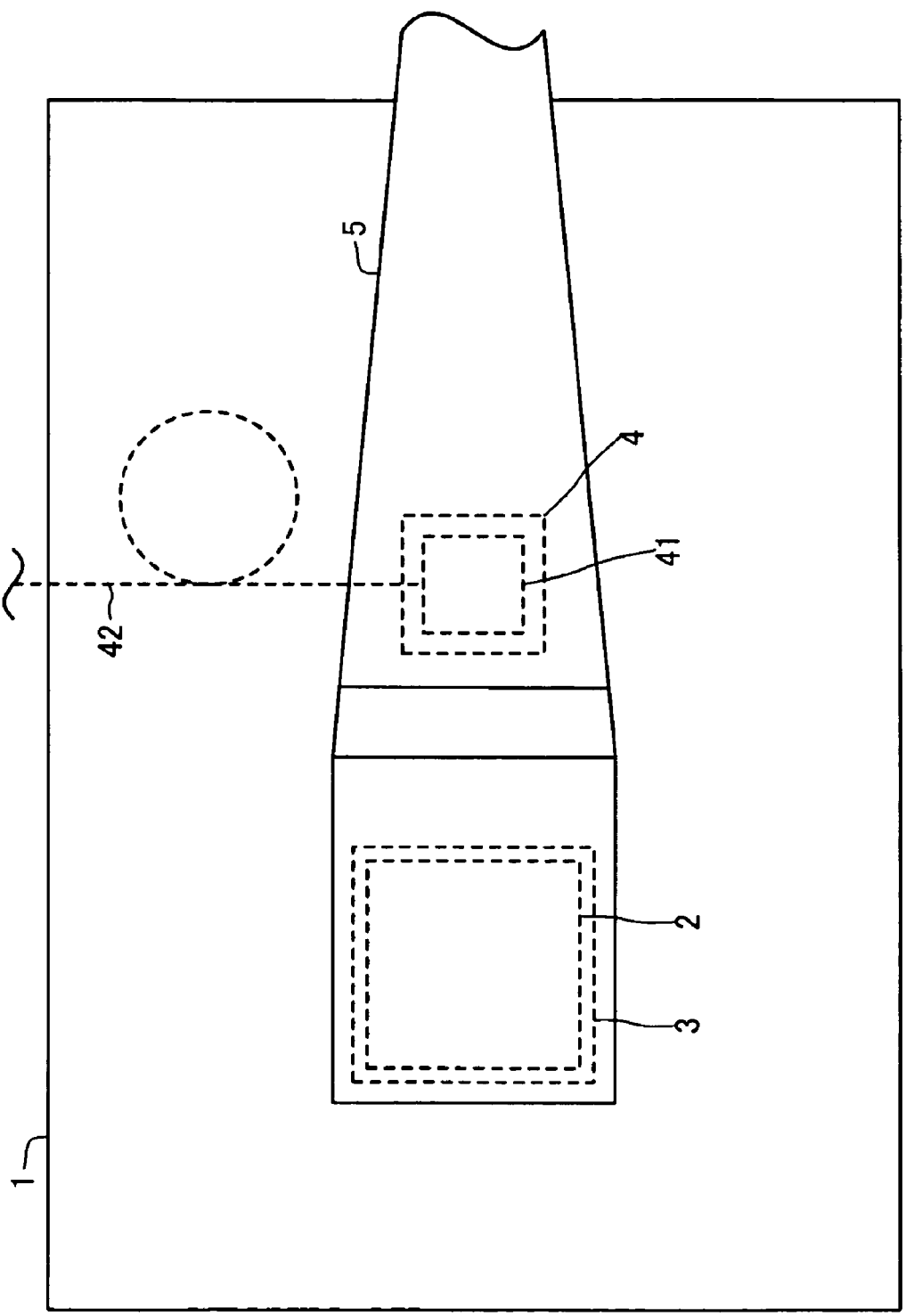

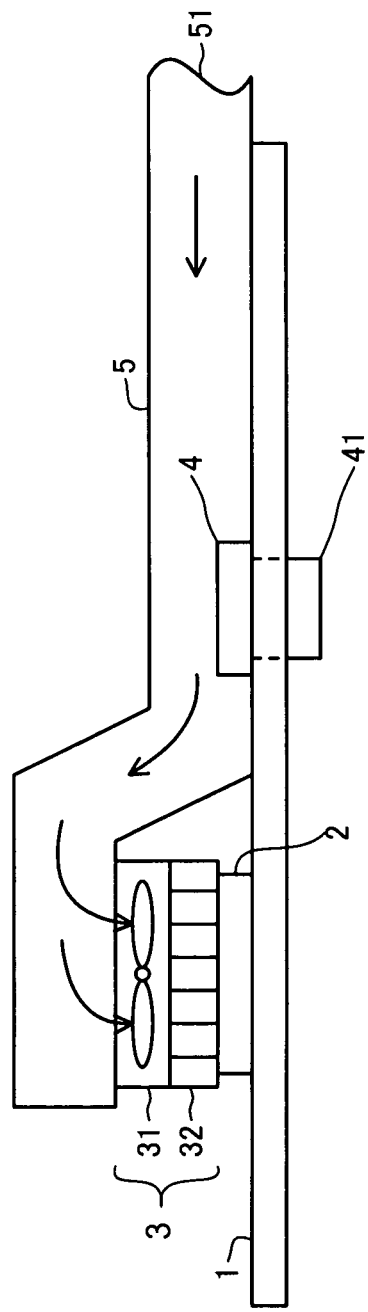
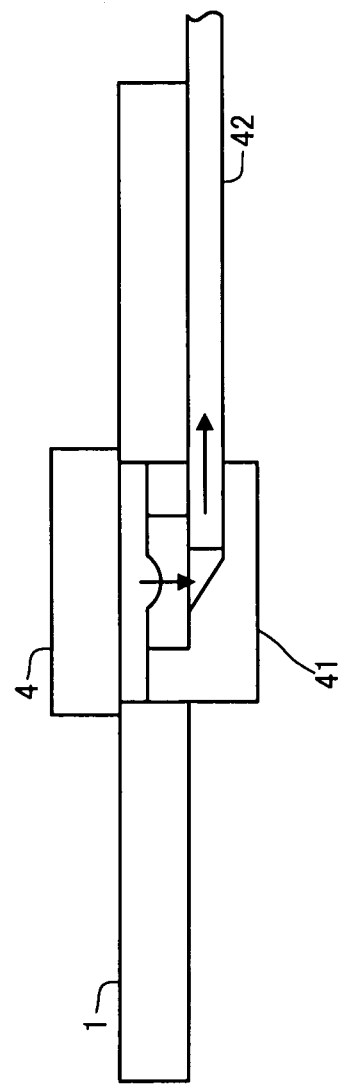

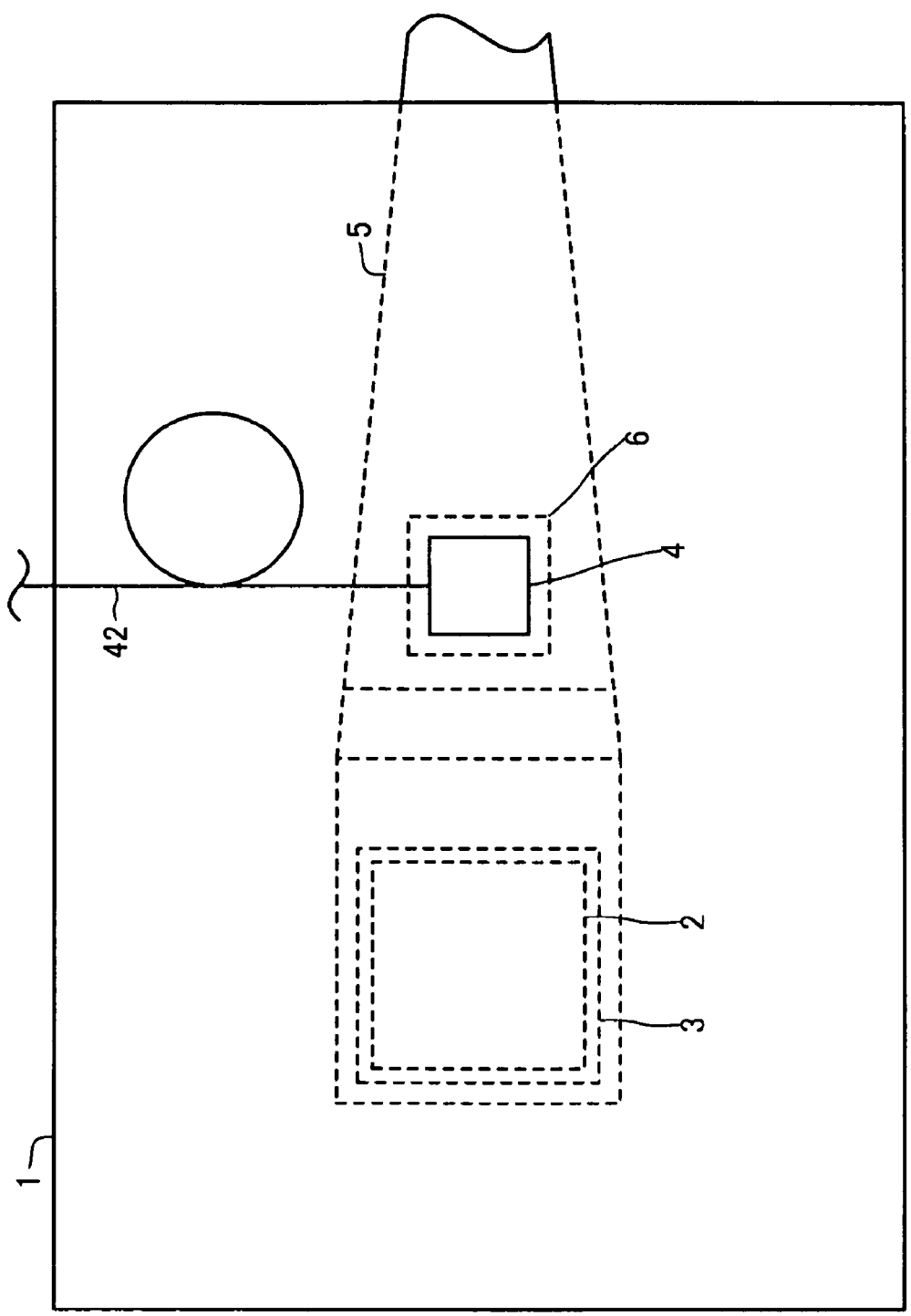

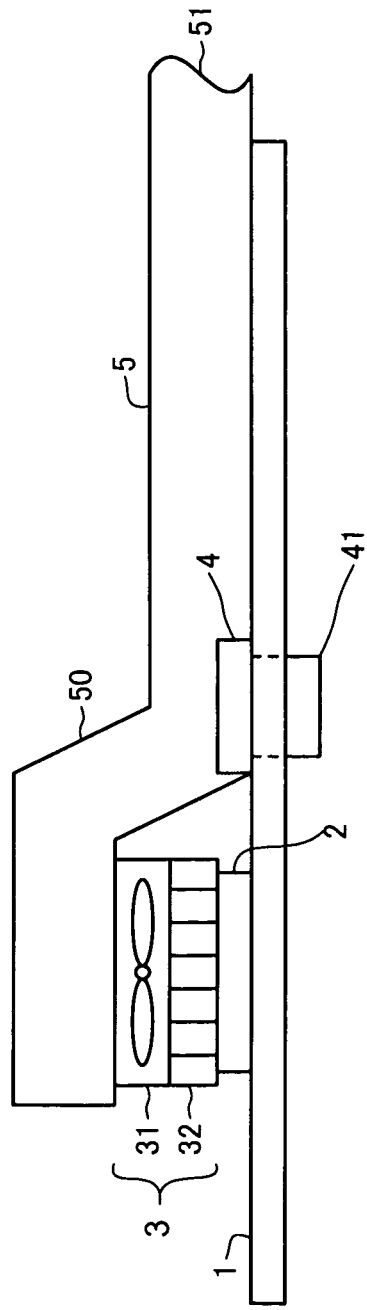
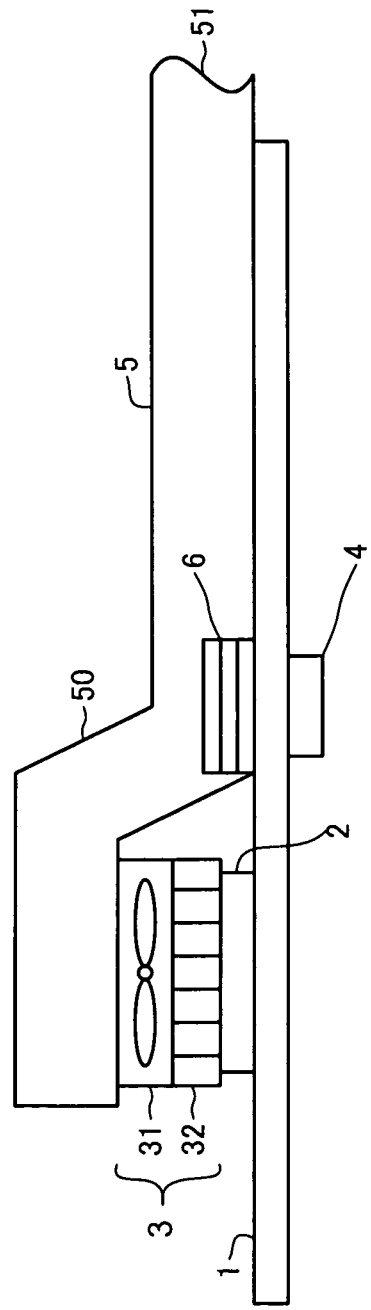

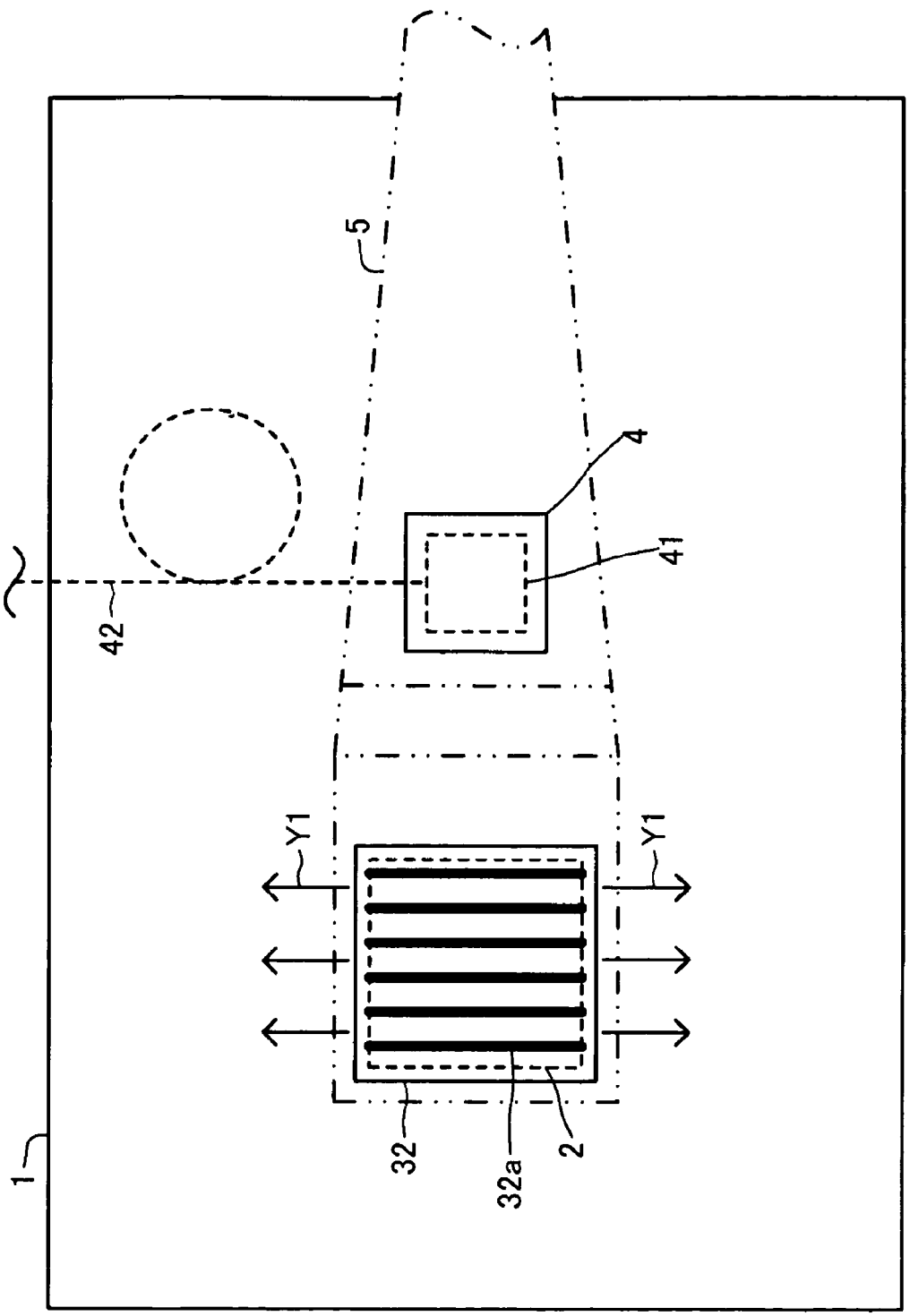

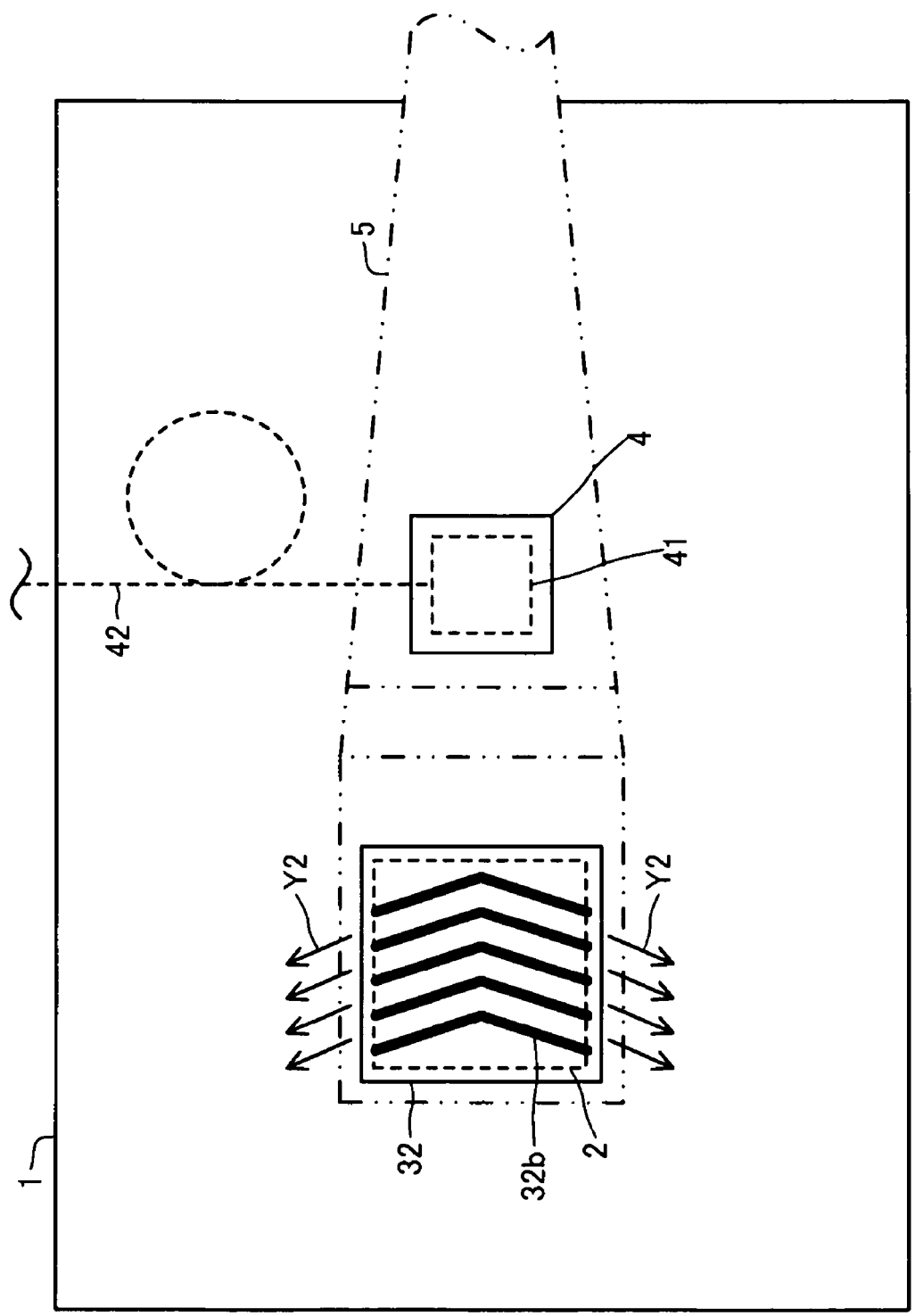

CIRCUIT BOARD

BACKGROUND OF THE INVENTION

This application claims priority to Japanese Application No. 2010-189673 filed Aug. 26, 2010, the entire content of each of which is hereby incorporated by reference in this application.

1. Field of the Invention

The present invention relates to a circuit board, and specifically relates to a circuit board provided with a control circuit and an optical module.

2. Description of Related Art

In accordance with increase of the performance of computers, the speed of signals inputted into and outputted from a CPU (Central Processing Unit) mounted in a computer has been getting higher. Therefore, it is a problem how to take measures against attenuation of high-speed electric signals propagating on a circuit board and against generation of noise in the signals.

To solve this problem, in recent years, such a method has been considered that high-speed electric signals are inputted into and outputted from a CPU by executing electro-optical conversion with a photoelectric conversion module (referred to as an "optical module" hereinafter) and optical signals are propagated at high speeds. An optical module has a function of converting electric signals into optical signals and vice versa.

In a method for taking measures against attenuation of high-speed electric signals with this optical module, such a characteristic is utilized that attenuation of power of optical signals propagating within an optical fiber or an optical waveguide is considerably smaller than that of electric signals propagating on a circuit board. In other words, in part of a section in which high-speed electric signals inputted and outputted are transmitted, the electric signals are converted into optical signals with an optical module and transmitted, and thereby, attenuation of the high-speed signals on a circuit board is reduced. Moreover, in a method for taking measures against generation of noise in high-speed electric signals, such a characteristic is utilized that optical signals propagating within an optical fiber are not influenced by electromagnetic waves from outside.

Since signals inputted into and outputted from the CPU are electric signals, there is a need to propagate high-speed electric signals on a circuit board in a section between the optical module and the CPU. Therefore, in order to increase the effect of transmission of signals by conversion of high-speed electric signals into optical signals, there is a need to minimize attenuation of the electric signals and generation of noise in the electric signals on the circuit board. Accordingly, it is required to make the length of the section where transmission signals propagate in the form of electric signals on the circuit board as short as possible.

[Patent Document 1] JP2010-67731A

However, the abovementioned optical module, in which an optical element and an optical-element driving IC are mounted on a transparent resin board, has a problem on heat radiation performance. An optical module, which executes photoelectric conversion, generally radiates heat when operating. To be specific, since an optical module has, for example, a configuration that a laser diode used as a light source element is driven by a driver IC, the optical module then consumes electric power and radiates heat. Accordingly, in order to sufficiently take advantage of the property of the laser diode, there is a need to cool by efficiently diffusing the radiated heat with a heat sink or the like.

On the other hand, since an optical module shown in FIG. 29 of JP2010-67731A has a light input/output part provided with a planar micro lens array on the upper face of a package, it is impossible to place a heat sink for cooling on the upper face of the optical module. Consequently, such a problem occurs that heat radiation in the optical module is limited to radiation by heat conduction from the lower face of the optical module to a circuit board, and moreover, it is impossible to sufficiently radiate heat because the material of the circuit board is usually resin.

Further, as mentioned before, there is a need to make the optical module as close as possible to the CPU in order to increase the effect of transmission of signals by conversion of high-speed electric signals of the CPU into optical signals, whereas such a problem occurs that the temperature of the optical module rises because of the influence of heat radiation of the CPU and exhausted heat by the CPU, and therefore, even the optical module provided with the heat sink cannot cool down if it is adjacent to the CPU.

SUMMARY OF THE INVENTION

Accordingly, an object of the present invention is to provide a circuit board capable of effectively cooling the control circuit and the optical module in spite of a close distance therebetween, which solves the abovementioned problems.

In order to achieve the above object, a circuit board placed inside a housing of electronic equipment and provided with an optical module and a control circuit, which are mutually connected, has: a fan-assisted heat sink mounted on the control circuit and configured to ventilate the control circuit and cool the control circuit; and a fresh air feeding duct placed on the circuit board and configured to distribute fresh air taken in from outside the housing through an intake of the fan-assisted heat sink. In the circuit board, the optical module is placed in a predetermined position along a site in which the fresh air feeding duct is formed.

For example, the circuit board has a configuration that the optical module is placed inside the fresh air feeding duct, or that the optical module is placed on the back face side of the site where the fresh air feeding duct is formed on the circuit board. Furthermore, the circuit board has a configuration that an optical module heat sink for cooling the optical module is placed inside the fresh air feeding duct in a site on the opposite side of the circuit board corresponding to the site where the optical module is placed.

According to the circuit board having the above configuration, firstly, through the fresh air feeding duct placed on the circuit board, fresh air is taken in from outside the housing and is flown to the intake of the fan-assisted heat sink, whereby the control circuit is cooled. At the same time, it is also possible to cool the optical module by the fresh air distributed in the fresh air feeding duct because the optical module is placed along the site where the fresh air feeding duct is formed, for example, inside the fresh air feeding duct, on the back face side thereof, or the like. Furthermore, in this case, since the optical module is placed along the site where the fresh air feeding duct leading to the control circuit is formed, it is possible to set a distance between the optical module and the control circuit short, and thus, it is possible to suppress degradation of signals. As a result, it is possible to produce a high-quality circuit board.

Further, in the above circuit board, the optical module heat sink is placed so that a fresh air flow inlet of the optical module heat sink faces a fresh air inlet through which fresh air flows into the fresh air feeding duct.

Consequently, since fresh air efficiently flows into the optical module heat sink, it is possible to efficiently cool the optical module.

Further, in the above circuit board, an outlet through which fresh air flown into the fan-assisted heat sink is exhausted is formed so as not to face to the fresh air feeding duct.

Consequently, though fresh air flown into the fan-assisted heat sink is exhausted after cooling the control circuit, and therefore, may be warmed when exhausted through the outlet, it is possible to prevent the exhausted fresh air from being sent to the fresh air feeding duct. As a result, it is possible to inhibit air inside the fresh air feeding duct from being warmed, and thus, it is possible to increase the efficiency in cooling the optical module and the control circuit.

Further, in the above circuit board: the intake of the fan-assisted heat sink is located upward at a predetermined height from a board face of the circuit board; the fresh air feeding duct is formed along the board face on the board face of the circuit board, and is formed so that a height-direction position of the fresh air feeding duct with respect to the board face of the circuit board becomes higher in the vicinity of the site where the fan-assisted heat sink is placed; and the optical module is placed in a site in which the fresh air feeding duct is formed with the height-direction position changed Consequently, it is possible to effectively inhibit the air warmed by the control circuit from flowing toward the optical module, and it is also possible to place the optical module closer to the control circuit. Consequently, it is possible to increase the cooling efficiency, and increase the quality of the circuit.

The present invention is thus configured and functions. Accordingly, it is possible to set a distance between the optical module and the control circuit short to suppress degradation of signals, and it is also possible to efficiently cool the optical module and the control circuit. Thus, it is possible to provide a high-quality circuit board.

BRIEF DESCRIPTION OF THE DRAWINGS

FIG. 1 is a top view showing the configuration of a circuit board in a first embodiment of the present invention.

FIG. 2 is a side view showing the configuration of the circuit board in the first embodiment of the present invention.

FIG. 3 is a view showing the configuration of an optical module of the circuit board shown in FIG. 2.

FIG. 5 is a bottom view showing the configuration of the circuit board in the second embodiment of the present invention.

FIG. 6 is a side view showing the configuration of a circuit board in a third embodiment of the present invention.

FIG. 7 is a side view showing the configuration of the circuit board in the third embodiment of the present invention.

FIG. 8 is a top view showing the configuration of a circuit board in a fourth embodiment of the present invention.

FIG. 9 is a top view showing the configuration of the circuit board in the fourth embodiment of the present invention.

DESCRIPTION OF THE EMBODIMENTS

First Embodiment

Figure 4:
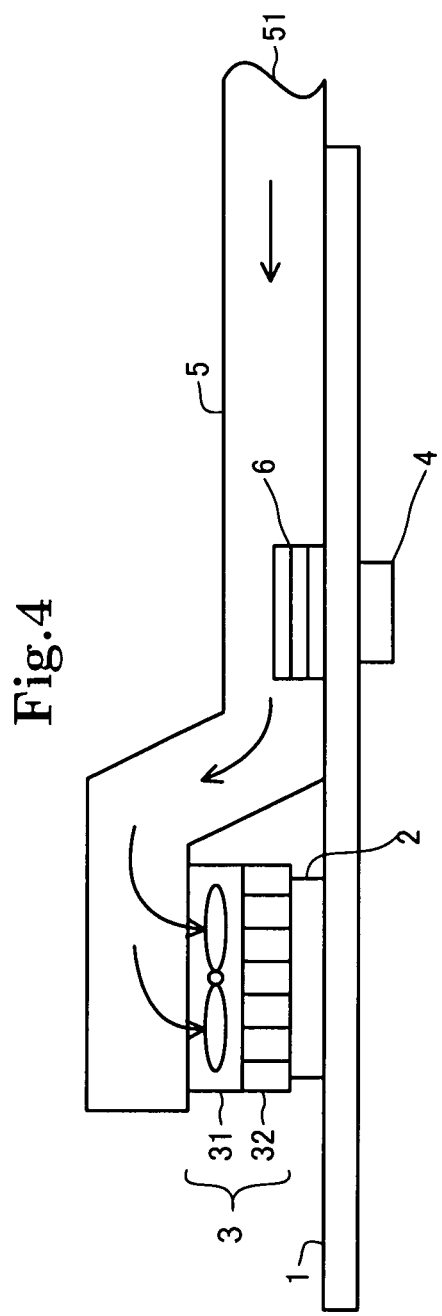
FIG. 4 is a side view showing the configuration of a circuit board in a second embodiment of the present invention.

A first embodiment of the present invention will be described with reference to FIGS. 1 to 3. FIG. 1 is a top view of a circuit board taken from above, and FIG. 2 is a side view of the circuit board taken from side. FIG. 3 is a view showing a detailed configuration of an optical module.

A circuit board 1 of this embodiment is placed inside the housing of electronic equipment such as an information processing terminal. On the circuit board 1, a control circuit 2 such as a CPU (Central Processing Unit) that controls the operation of the electronic equipment, and an optical module 4 such as a semiconductor laser are mounted. The control circuit 2 and the optical module 4 are mutually connected by an electric circuit, and electric signals to be subjected to electro-optical conversion are inputted and outputted between the control circuit 2 and the optical module 4.

Further, on the control circuit 2, a fan-assisted heat sink 3 for ventilating and cooling the control circuit 2 is mounted. To be specific, a heat sink 32 including a number of fins having a heat exchange function is mounted on the control circuit 2, and moreover, a fan 31 that makes fresh air flow into the heat sink 32 is mounted thereon. A fresh air flow inlet of the fan-assisted heat sink 3 is placed in parallel to the board face of the circuit board 1, namely, placed so as to face in the perpendicular direction to the board face, and located upward from the board face of the circuit board 1. Therefore, a direction in which fresh air flows into the fan-assisted heat sink 3 is perpendicular to the board face of the circuit board 1.

On the circuit board 1 of this embodiment, a fresh air feeding duct 5 that feeds fresh air into the fan-assisted heat sink 3 is formed on the board face. This fresh air feeding duct 5 is a duct path surrounded by the circuit board 1 and wall faces, and one end side 51 is exposed to the outside of the housing to form a fresh air inlet.

To be specific, up to the vicinity of a site in which the control circuit 2 is mounted, the fresh air feeding duct 5 is formed by a predetermined duct path on a side on which the control circuit 2 is mounted on the circuit board 1. In the vicinity of the control circuit 2, the fresh air feeding duct 5 changes its form so as to separate from the board face of the circuit board 1 in a manner that a height-direction position of the fresh air feeding duct 5 becomes higher. That is to say, the fresh air feeding duct 5 is formed so as to extend obliquely upward to above the fan-assisted heat sink 3 mounted on the control circuit 2, in a site around the control circuit 2. Furthermore, on the fan-assisted heat sink 3, the fresh air feeding duct 5 covers the intake of the fan 31 of the fan-assisted heat sink 3 and is terminated. Consequently, the fresh air feeding duct 5 takes in fresh air through the fresh air inlet of the one end side 51 by suction power of the fan 31 of the fan-assisted heat sink 3, and the fresh air is distributed inside the fresh air feeding duct 5 up to the fan-assisted heat sink 3 on the other end side (refer to arrows in FIG. 2).

Since the intake of the fan-assisted heat sink 3 is placed so as to face in the perpendicular direction to the board face of the circuit board 1 as mentioned before and the fresh air feeding duct 5 is formed so as to extend substantially along the board face of the circuit board 1, the intake of the fan-assisted heat sink 3 does not face to a direction in which fresh air flows in. Accordingly, it is possible to inhibit flow of air warmed by the control circuit 2 from the intake of the fan-assisted heat sink 3 to the fresh air feeding duct 5, and thus, it is possible to increase the cooling efficiency.

Further, in this embodiment, the aforementioned optical module 4 is mounted on the circuit board 1 in any site located inside the fresh air feeding duct 5. Now, the configuration of the optical module 4 will be described with reference to FIG. 3.

The optical module 4 is, for example, a vertical-cavity-surface-emitting semiconductor laser that emits laser in the perpendicular direction to the board face, which emits laser toward the lower face of the circuit board 1 herein. Below the optical module 4, namely, on the back face of the circuit board 1, an optical transmission component 41 such as a lens or a reflection mirror that transmits optical signals outputted from the optical module 4 to an optical fiber 42 is mounted, and signals converted from electric signals are thereby transmitted through the optical fiber 42 (refer to arrows in FIG. 3).

As mentioned before, the optical module 4 is placed inside the duct path of the fresh air feeding duct 5, and therefore, is exposed to fresh air before reaching the control circuit 2 at all times. Accordingly, it is possible to certainly cool the optical module 4 with efficiency. Moreover, since the fresh air after cooling the optical module 4 flows into the control circuit 2, it is also possible to cool the control circuit 2.

Furthermore, since the optical module 4 is placed inside the fresh air feeding duct 4 leading to the control circuit 2, a distance between the optical module 4 and the control circuit 2 becomes short inevitably. Accordingly, it is possible to suppress degradation of signals between the optical module 4 and the control circuit 2, and high-speed transmission of signals is allowed, whereby it is possible to realize a high-quality circuit board.

The position to place the optical module 4 is not limited to the aforementioned position. Even if the optical module 4 is placed in any position along the site where the fresh air feeding duct 5 is formed, it is possible to cool the optical module 4 by fresh air distributed in the fresh air feeding duct 5. For example, the optical module 4 may be placed not only inside the fresh air feeding duct 5 but also in contact with the wall face in any position of the fresh air feeding duct 5. Furthermore, the optical module 4 may be provided with a heat sink that cools the optical module 4. For example, the heat sink may be incorporated into the optical module 4 as a part thereof, or may be mounted so as to be adjacent to the optical module 4. Consequently, it is possible to further increase the heat radiation efficiency of the optical module 4.

Second Embodiment

Next, a second embodiment of the present invention will be described with reference to FIGS. 4 and 5. FIG. 4 is a side view of a circuit board taken from side, and FIG. 5 is a bottom view of the circuit board taken from bottom.

The circuit board 1 in this embodiment is configured in substantially the same manner as that of the first embodiment, but in this embodiment, is particularly different in that the optical module 4 is mounted on the opposite face of the circuit board 1 to the face on which the control circuit 2 is mounted.

To be specific, as shown in FIG. 4, an optical module heat sink 6 is mounted in a predetermined site of the fresh air feeding duct 5, for example, in the site where the optical module 4 is mounted in the first embodiment. This optical module heat sink 6 includes a number of fins having a heat exchange function, and a fresh air flow inlet of the optical module heat sink 6 is placed so as to face the fresh air inlet 51 of the fresh air feeding duct 5. Consequently, fresh air efficiently flows into the optical module heat sink 6.

Below the optical module heat sink 6, namely, on the back face of the circuit board 1 in the site where the optical module heat sink 6 is mounted, the optical module 4 is mounted. Although not shown in the drawings, as described in the first embodiment, various components that transmit optical signals outputted from the optical module 4 to the optical fiber 42 are mounted. As in a view of FIG. 5 showing the back face of the circuit board 1, the optical module 4 and the optical fiber 42 are connected by the optical transmission component 41 as described before.

Also in the above configuration, the optical module heat sink 6 is placed inside the fresh air feeding duct 5, and therefore, is exposed to fresh air before reaching the control circuit 2 at all times. Heat of the optical module 4 adjacent to the optical module heat sink 6 is certainly subjected to heat exchange with efficiency, and the optical module 4 can by cooled thereby. Moreover, since the fresh air after cooling the optical module 4 flows into the control circuit 2, the control circuit 2 can be cooled.

Further, since the optical module 4 is placed on the back face side of the fresh air feeding duct 5 leading to the control circuit 2, it is possible to place the optical module 4 and the control circuit 2 at a closer distance. Therefore, it is possible to suppress signal degradation between the optical module 4 and the control circuit 2, and high-speed signal transmission is allowed, whereby a high-quality circuit board can be realized. Furthermore, since it is possible to mount a wire connected to the optical module 4, and the like, on the opposite face to the face where the control circuit 2 is mounted, it is possible to simplify the configuration of the circuit.

The positions to place the optical module 4 and the optical module heat sink 6 are not limited to the aforementioned positions. The optical module 4 and the optical module heat sink 6 may be placed in any positions along the site where the fresh air feeding duct 5 is formed. The aforementioned optical module 4 and optical module heat sink 6 may be integrally configured. For example, the optical module heat sink 6 may be incorporated into the optical module 4 as a part thereof, or the optical module heat sink 6 may be mounted more adjacent to the optical module 4 so that the optical module heat sink 6 and the optical module 4 are integrally configured. Consequently, it is possible to further increase the heat radiation efficiency of the optical module 4.

Third Embodiment

Next, a third embodiment of the present invention will be described with reference to FIGS. 6 and 7. FIG. 6 is a side view of a circuit board having a configuration of this embodiment taken from side, and FIG. 7 is a side view showing another example of the configuration of the circuit board according to this embodiment.

Although the circuit board 1 according to this embodiment has almost the same configuration as those of the aforementioned first and second embodiments, a placement position of the optical module 4 in this embodiment is different from those in the aforementioned embodiments.

To be specific, firstly, in an example shown in FIG. 6, the optical module 4 is placed inside the fresh air feeding duct 5 in a like manner as in the first embodiment. However, particularly, in a site 50 in which the fresh air feeding duct 5 bends, namely, in a site 50 close to the control circuit 2 in which the fresh air feeding duct 5 separates from the board face of the circuit board 1 and the height-direction position thereof changes so that the fresh air feeding duct 5 bends and extends, the optical module 4 is mounted.

Further, in an example shown in FIG. 7, the optical module heat sink 6 is placed inside the fresh air feeding duct 5 in a like manner as in the second embodiment, and the optical module 4 is placed on the back face side. However, particularly, in a site 50 in which the fresh air feeding duct 5 bends, namely, in a site 50 close to the control circuit 2 in which the fresh air feeding duct 5 separates from the board face of the circuit board 1 and the height-direction position thereof changes so that the fresh air feeding duct 5 bends and extends, the optical module heat sink 6 and the optical module 4 are mounted.

With such configurations, it is possible to mount the optical module 4 closer to the control circuit 2, and it is possible to suppress degradation of signals, whereby it is possible to realize a high-quality circuit board.

Fourth Embodiment

Next, a fourth embodiment of the present invention will be described with reference to FIGS. 8 and 9. FIGS. 8 and 9 are top views of the circuit board as shown by the side view of FIG. 2 taken from above, and particularly, show the structure of the fins of the heat sink 32 composing the fan-assisted heat sink 3 while omitting illustration of the fresh air feeding duct 5 (shown by a long dashed double short dashed line) and the fan part 31 of the fan-assisted heat sink 3.

Firstly, in an example shown in FIG. 8, the heat sink 32 composing the fan-assisted heat sink 3 is provided with a plurality of plate-like fins 32a extending in the perpendicular direction to the longitudinal direction of the fresh air feeding duct 5. That is to say, an outlet through which the fresh air flown in the fins 32a is exhausted is formed not facing to the fresh air feeding duct 5 but facing in the perpendicular direction to the longitudinal direction of the fresh air feeding duct 5.

Consequently, fresh air is fed from above to between the respective fins 32a, the fresh air is sent to the control circuit 2 placed therebelow, and then, as shown by arrows Y1, the fresh air is exhausted in the perpendicular direction to the longitudinal direction of the fresh air feeding duct 5. Therefore, the fresh air passed and exhausted through the fins 32a may be warmed because exhausted after cooling the control circuit 2, but it is possible to prevent the exhausted fresh air from being blown to the fresh air feeding duct 5. As a result, it is possible to prevent air within the fresh air feeding duct 5 from being warmed by the air exhausted from the fins 32a, and thus, it is possible to increase the efficiency in cooling the optical module 4 and the control circuit 2.

Further, in an example shown in FIG. 9, the heat sink 32 composing the fan-assisted heat sink 3 is provided with a plurality of plate-like fins 32b bent into V-shape. The fins 32b bent into V-shape are formed so that each of the fins 32b bends toward the opposite side to the side where the duct path of the fresh air feeding duct 5 is formed while extending from the center to both the sides in the heat sink 32. That is to say, an outlet through which the fresh air flown in the fins 32b is exhausted is formed not facing to the fresh air feeding duct 5 but facing to the opposite side to the side where the duct path of the fresh air feeding duct 5 is formed.

Consequently, fresh air is fed from above to between the respective fins 32b, the fresh air is sent to the control circuit 2 placed therebelow, and then, as shown by arrows Y2, the fresh air is exhausted toward the opposite side to the duct path of the fresh air feeding duct 5. Accordingly, the fresh air passed and exhausted through the fins 32b may be warmed because exhausted after cooling the control circuit 2, but it is possible to prevent the exhausted fresh air from being blown to the fresh air feeding duct 5. As a result, it is possible to prevent air within the fresh air feeding duct 5 from being warmed by the air exhausted from the fins 32b, and thus, it is possible to increase the efficiency in cooling the optical module 4 and the control circuit 2.

The invention claimed is:

1. A circuit board placed inside a housing of electronic equipment and provided with an optical module and a control circuit, which are mutually connected, the circuit board comprising:

a fan-assisted heat sink mounted on the control circuit and configured to ventilate the control circuit and cool the control circuit; and a fresh air feeding duct placed on the circuit board and configured to distribute fresh air taken in from outside the housing through an intake of the fan-assisted heat sink, the fresh air feeding duct having first and second end sides, and the fresh air feeding duct takes in fresh air through a fresh air inlet of one end side and distributes the fresh air up to the fan-assisted heat sink on the other end side, wherein the optical module is placed in a predetermined position inside or outside a duct path of the fresh air feeding duct along a site in which the fresh air feeding duct is formed.

2. The circuit board according to claim 1, wherein the optical module is placed inside the fresh air feeding duct.

3. The circuit board according to claim 1, wherein an outlet through which fresh air flown into the fan-assisted heat sink is exhausted is formed so as not to face to the fresh air feeding duct.

4. A circuit board placed inside a housing of electronic equipment and provided with an optical module and a control circuit, which are mutually connected, the circuit board comprising:

a fan-assisted heat sink mounted on the control circuit and configured to ventilate the control circuit and cool the control circuit; and a fresh air feeding duct placed on the circuit board and configured to distribute fresh air taken in from outside the housing through an intake of the fan-assisted heat sink, wherein the optical module is placed in a predetermined position inside or outside a duct path of the fresh air feeding duct along a site in which the fresh air feeding duct is formed, and wherein the optical module is placed on a back face side of the site where the fresh air feeding duct is formed on the circuit board.

5. The circuit board according to claim 4, wherein an optical module heat sink configured to cool the optical module is placed inside the fresh air feeding duct in a site on an opposite side of the circuit board corresponding to the site where the optical module is placed.

6. The circuit board according to claim 5, wherein the optical module heat sink is placed so that a fresh air flow inlet of the optical module heat sink faces a fresh air inlet through which fresh air flows into the fresh air feeding duct.

7. A circuit board placed inside a housing of electronic equipment and provided with an optical module and a control circuit, which are mutually connected, the circuit board comprising:

a fan-assisted heat sink mounted on the control circuit and configured to ventilate the control circuit and cool the control circuit; and a fresh air feeding duct placed on the circuit board and configured to distribute fresh air taken in from outside the housing through an intake of the fan-assisted heat sink, wherein:

the optical module is placed in a predetermined position inside or outside a duct path of the fresh air feeding duct along a site in which the fresh air feeding duct is formed;

the intake of the fan-assisted heat sink is located upward at a predetermined height from a board face of the circuit board;

the fresh air feeding duct is formed on the board face of the circuit board along the board face, and is formed so that a height-direction position of the fresh air feeding duct with respect to the board face of the circuit board is higher in the vicinity of the site where the fan-assisted heat sink is placed; and the optical module is placed in a site in which the fresh air feeding duct is formed with the height-direction position changed.

8. Electronic equipment having a circuit board inside a housing, the circuit board being provided with an optical module and a control circuit, which are mutually connected, wherein:

the circuit board comprises: a fan-assisted heat sink mounted on the control circuit and configured to ventilate the control circuit and cool the control circuit; and a fresh air feeding duct placed on the circuit board and configured to distribute fresh air taken in from outside the housing through an intake of the fan-assisted heat sink, the fresh air feeding duct having first and second end sides;

the fresh air feeding duct takes in fresh air through a fresh air inlet of one end side and distributes the fresh air up to the fan-assisted heat sink on the other end side, and on the circuit board, the optical module is placed in a predetermined position inside or outside a duct path of the fresh air feeding duct along a site in which the fresh air feeding duct is formed.

* * * * *